(12) United States Patent
Yuan

(10) Patent No.: US 10,985,185 B2
(45) Date of Patent: Apr. 20, 2021

(54) DISPLAY PANEL AND DISPLAY DEVICE

(71) Applicant: XIAMEN TIANMA MICRO-ELECTRONICS CO., LTD., Xiamen (CN)

(72) Inventor: Yong Yuan, Shanghai (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 0 days.

(21) Appl. No.: 16/231,963

(22) Filed: Dec. 25, 2018

(65) Prior Publication Data

US 2019/0131321 A1    May 2, 2019

(30) Foreign Application Priority Data

Sep. 30, 2018 (CN) .......................... 201811158998.2

(51) Int. Cl.
*H01L 27/12*  (2006.01)
*H01L 29/786*  (2006.01)
*H01L 27/32*  (2006.01)

(52) U.S. Cl.
CPC ...... *H01L 27/1218* (2013.01); *H01L 27/1225* (2013.01); *H01L 27/1248* (2013.01);
(Continued)

(58) Field of Classification Search
CPC ......... H01L 29/78675; H01L 29/78678; H01L 29/7869; H01L 27/12; H01L 27/1214; H01L 27/1218; H01L 27/1222; H01L 27/1229; H01L 27/1233; H01L 27/1237; H01L 27/1248; H01L 27/3244; H01L 27/3258; H01L 27/1251; H01L 27/1225;
(Continued)

(56) References Cited

U.S. PATENT DOCUMENTS 9,515,099 B2 * 12/2016 Kwon ................. H01L 27/1244
2015/0243718 A1 * 8/2015 Kwon ................. H01L 27/1248
                                                                257/43

(Continued)

FOREIGN PATENT DOCUMENTS

CN    107112330 A    8/2017
CN    107818991 A    3/2018

OTHER PUBLICATIONS

Office Action of Chinese Patent Application No. 201811158998.2 dated Oct. 19, 2020.

*Primary Examiner* — Natalia A Gondarenko
(74) *Attorney, Agent, or Firm* — Kilpatrick Townsend & Stockton, LLP

(57) ABSTRACT

A display panel and a display device are provided. The display panel is an LTPO display panel including at least one LTPS thin film transistor and at least one Oxide thin film transistor. The LTPS thin film transistor and the Oxide thin film transistor are both formed on the side of the buffer layer facing away from the substrate. A groove structure or a hollow structure is provided on the buffer layer at a position corresponding to the Oxide thin film transistor, and the Oxide thin film transistor is fabricated in the groove structure or the hollow structure, to avoid the case that the great height by which the Oxide thin film transistor protrudes from the substrate causes a great thickness of the LTPO display panel.

15 Claims, 12 Drawing Sheets

(52) U.S. Cl.
CPC ...... *H01L 27/1251* (2013.01); *H01L 29/7869* (2013.01); *H01L 29/78675* (2013.01); *H01L 29/78678* (2013.01); *H01L 27/3262* (2013.01)

(58) Field of Classification Search
CPC ............. H01L 27/3262; H01L 2227/32; H01L 2227/323; H01L 2227/326; H01L 29/66969; H01L 29/66757; H01L 27/1262; H01L 27/1244; H01L 27/3276; H01L 51/5253; H01L 51/0097; H01L 51/5237; H01L 21/76; H01L 21/762; H01L 21/76205; H01L 21/76208; H01L 21/7621; H01L 21/76232; H01L 21/76297; H01L 21/76802; H01L 21/76805; H01L 21/76819; H01L 21/76843; G09F 9/301; G09F 9/302
USPC ......................................... 257/43, 72, 75, 88
See application file for complete search history.

(56) References Cited

U.S. PATENT DOCUMENTS

| | | | |
|---|---|---|---|
| 2015/0243724 A1* | 8/2015 | Cho | H01L 27/1251 257/43 |
| 2015/0287747 A1* | 10/2015 | Cheng | G02F 1/133305 257/72 |
| 2018/0330663 A1* | 11/2018 | Yang | G09G 3/3225 |
| 2018/0337332 A1* | 11/2018 | Deng | H01L 27/3258 |
| 2019/0123069 A1* | 4/2019 | Yang | H01L 27/1218 |
| 2019/0259822 A1* | 8/2019 | Jeon | H01L 27/3262 |
| 2019/0279575 A1* | 9/2019 | Kim | G09G 3/3266 |

\* cited by examiner

DISPLAY PANEL AND DISPLAY DEVICE

This application claims the priority to Chinese patent application No. 201811158998.2 titled "DISPLAY PANEL AND DISPLAY DEVICE", filed with the Chinese Patent Office on Sep. 30, 2018, which is incorporated herein by reference in its entirety.

FIELD

The present disclosure relates to the field of displays, and particularly to a display panel and a display device.

BACKGROUND

An Organic Light Emitting Diode (OLED) device is a self-emitting display device. The OLED device includes multiple organic light emitting devices, each of which includes an anode, a cathode, and an organic light emitting layer between the anode and the cathode. Electron injection and hole injection into the organic light emitting layer are respectively performed through the cathode and the anode, excitons are generated by combining holes and electrons in the organic light emitting layer, and light is generated due to transition of these excitons from an excited state to a ground state.

As a self-emitting display device, the OLED device does not require a separate light source. Therefore, the OLED device can be driven by a low voltage and can be easily fabricated into a thin and light profile. In addition, the OLED device has the advantages of a wide viewing angle, a high contrast and a high response speed, so the OLED device is widely used in various fields, such as in display devices of smart mobile terminals, televisions, and computers, and foldable or rollable display devices.

At present, most of the OLED devices use the Low Temperature Poly-silicon (LTPS) Thin Film Transistor (TFT) panels. After the improvement in the past few years, the LTPS display panel becomes the most mature and mainstream TFT panel solution on the market today due to the advantages of high resolution, a high response speed, high brightness, and a high aperture ratio. Although the LTPS display panel has been welcomed by the market, it has the disadvantage of high production cost and large power consumption.

Therefore, the LTPO (Low Temperature Polycrystalline Oxide) display panel, which combines the LTPS display technology and the Oxide display technology is developed. The LTPO display panel has not only the advantages of high resolution, the high response speed, high brightness, and the high aperture ratio of the LTPS display panel, but also the advantages of a low production cost and low power consumption. However, the LTPO display panel has a great thickness.

SUMMARY

A display panel and a display device are provided according to the present disclosure. The display panel is an LTPO display panel including at least one LTPS thin film transistor and at least one Oxide thin film transistor. The LTPS thin film transistor and the Oxide thin film transistor are both fabricated after the buffer layer is formed, that is, the LTPS thin film transistor and the Oxide thin film transistor are both formed on the side of the buffer layer facing away from the substrate. A groove structure or a hollow structure is provided on the buffer layer at a position corresponding to the Oxide thin film transistor, and the Oxide thin film transistor is fabricated in the groove structure or the hollow structure, to avoid the case that the great height by which the Oxide thin film transistor protrudes from the substrate causes a great thickness of the LTPO display panel, thereby effectively solving the problem of the great thickness of the existing LTPO display panel. The small thickness of the flexible LTPO display panel is beneficial for bending.

BRIEF DESCRIPTION OF THE DRAWINGS

The drawings to be used in the description of the embodiments will be described briefly as follows. It is apparent that the drawings in the following description only illustrate some embodiments of the present disclosure.

DETAILED DESCRIPTION

Embodiments of the present disclosure will be described clearly and completely as follows in conjunction with the drawings. It is apparent that the described embodiments are only a few rather than all of the embodiments according to the present disclosure.

As described in the BACKGROUND, the LTPO (Low Temperature Polycrystalline Oxide) display panel, which combines the LTPS display technology and the Oxide display technology is developed. The LTPO display panel has not only the advantages of high resolution, the high response speed, high brightness, and the high aperture ratio of the LTPS display panel, but also the advantages of a low production cost and low power consumption. However, the LTPO display panel has a great thickness.

Based on this, a display panel and a display device are provided according to the present disclosure to solve the problem of the great thickness of the existing LTPO display panel, which facilitates bending of the flexible LTPO display panel. Embodiment of the present disclosure are described in detail in conjunction with FIGS. 1 to 11.

Figure 1:
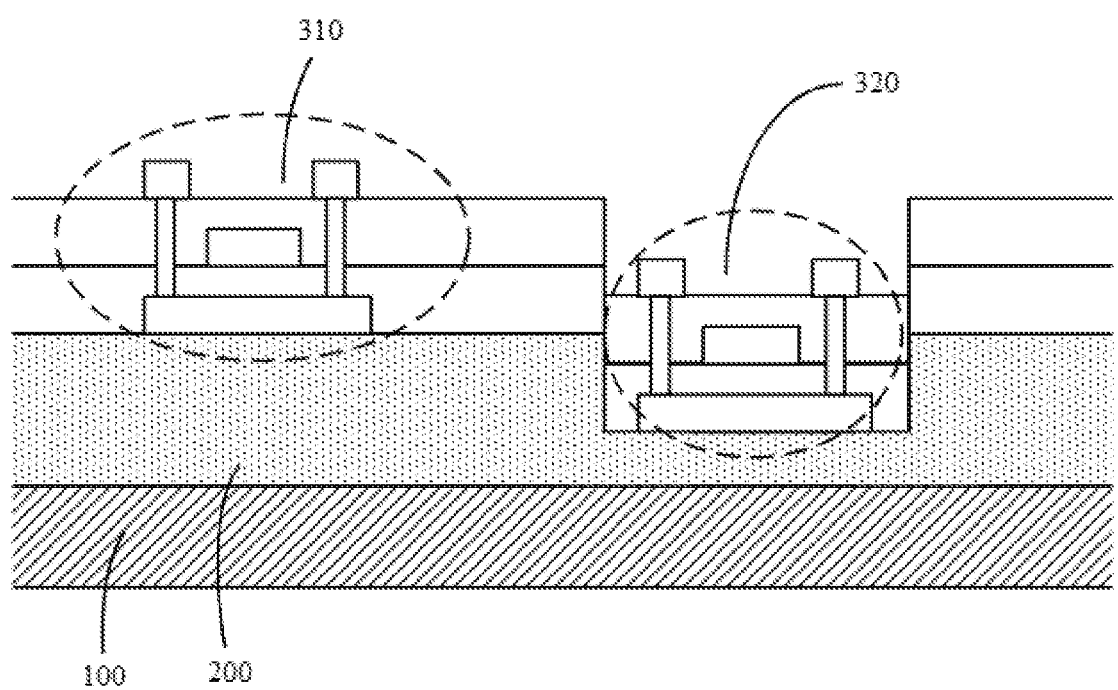
FIG. 1 is a schematic structural diagram of a display panel according to an embodiment of the present disclosure.

Referring to FIG. 1, which is a schematic structural diagram of a display panel according to an embodiment of the present disclosure, the display panel includes: a substrate 100, a buffer layer 200 located on a surface of the substrate 100, and at least one LTPS thin film transistor 310 and at least one Oxide thin film transistor 320 located on a side of the buffer layer 200 facing away from the substrate. The buffer layer 200 is provided with a groove structure or a hollow structure at a position corresponding to the Oxide thin film transistor 320.

In an embodiment of the present disclosure, the buffer layer 200 according to the embodiment of the present disclosure has one or a combination of a function of blocking impurities in the substrate 100 entering the thin film transistor, a function of performing lattice matching with the thin film transistor and a function of preventing water vapor erosion. The buffer layer 200 may be a single film layer, or may be formed by multiple sub-buffer film layers which are stacked, which is not limited herein.

As shown in FIG. 1, according to the present disclosure, the buffer layer 200 is provided with a groove structure at a position corresponding to the Oxide thin film transistor 320. In a case that the buffer layer 200 is formed by multiple sub-buffer film layers which are stacked, the groove structure of the buffer layer 200 may be formed by any one or more sub-buffer film layers being trenched or hollowed out at this position.

Figure 2:
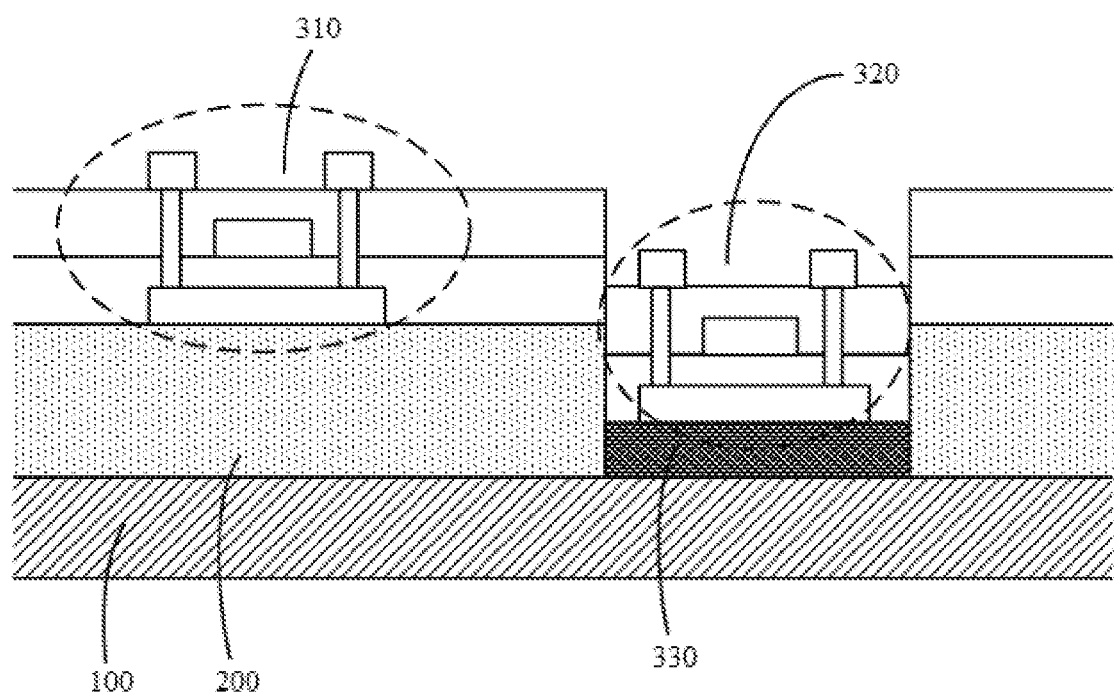
FIG. 2 is a schematic structural diagram of a display panel according to another embodiment of the present disclosure.

According to an embodiment of the present disclosure, the buffer layer 200 may be provided with a hollow structure at the position corresponding to the Oxide thin film transistor 320, and the Oxide thin film transistor 320 may be directly formed in the hollow structure. Further, an auxiliary film layer may be formed in the hollow structure, and the Oxide thin film transistor 320 is fabricated on the auxiliary film layer. Referring to FIG. 2, which is a schematic structural diagram of a display panel according to another embodiment of the present disclosure, in a case that the buffer layer 200 is provided with a hollow structure at the position corresponding to the Oxide thin film transistor 320, the display panel further includes an auxiliary film layer 330 located between the Oxide thin film transistor 320 and the substrate.

A surface of the auxiliary film layer 330 facing away from the substrate 100 is lower than a surface of the buffer layer 200 facing away from the substrate 100.

It should be understood that, the surface of the auxiliary film layer 330 facing away from the substrate 100 is lower than the surface of the buffer layer 200 at the same side, to avoid a great thickness of the auxiliary film layer 330, such that the thickness at this position is small after the Oxide thin film transistor 320 is fabricated, to avoid the case that the great height by which the Oxide thin film transistor protrudes from the substrate causes a great thickness of the LTPO display panel.

It should be noted that the auxiliary film layer according to the embodiment of the present disclosure may be a single film layer, or may be formed by multiple sub-film layers which are stacked, which is not limited in this disclosure. In one embodiment, the auxiliary film layer according to the embodiment of the present disclosure is an inorganic film layer, which functions to effectively prevent erosion of water vapor to the thin film transistor. In addition, the auxiliary film layer according to the embodiment of the present disclosure may be separately formed. In one embodiment, any one of insulating layers of the UPS thin film transistor may function as the auxiliary film layer according to the embodiment of the present disclosure. That is, a gate insulating layer, or an interlayer insulating layer for fabricating the LTPS thin film transistor may function as the auxiliary film layer, which is not limited in the present disclosure.

As can be seen from the above, the display panel according to the embodiment of the present disclosure is an LTPO display panel including at least one LTPS thin film transistor and at least one Oxide thin film transistor. The LTPS thin film transistor and the Oxide thin film transistor are both fabricated after the buffer layer is formed, that is, the LTPS thin film transistor and the Oxide thin film transistor are both formed on the side of the buffer layer facing away from the substrate. A groove structure or a hollow structure is provided on the buffer layer at a position corresponding to the Oxide thin film transistor, and the Oxide thin film transistor is fabricated in the groove structure or the hollow structure, such that a surface of the Oxide thin film transistor facing away from the substrate is lower than a surface of the LTPS thin film transistor facing away from the substrate, to avoid the case that the great height by which the Oxide thin film transistor protrudes from the substrate causes a great thickness of the LTPO display panel, thereby effectively solving the problem of the great thickness of the existing LTPO display panel. The small thickness of the flexible LTPO display panel is beneficial for bending.

In a case that the LTPO display panel according to the embodiment of the present disclosure is an OLED display panel, after a transistor layer including the LTPS thin film transistor and the Oxide thin film transistor is formed, a planarization layer, an anode layer, a pixel defining layer, a light emitting layer, and a cathode layer are formed on a side of the transistor layer facing away from the substrate. Since the thickness of the formed transistor layer is less than the thickness in the conventional technology, the final thickness of the fabricated LTPO display panel is less than that in the conventional technology. If the LTPO display panel is adopted in a flexible display panel, the less thickness of the flexible LTPO display panel is advantageous for bending.

In an embodiment of the present disclosure, the buffer layer according to the present disclosure may have a thickness ranging from 8,000 angstroms to 10,000 angstroms, inclusive. In a case that the buffer layer is provided with the groove structure at the position corresponding to the Oxide thin film transistor according to the embodiment of the present disclosure, the groove structure may have a thickness ranging from 1,500 angstroms to 2,500 angstroms, inclusive. In one embodiment, in a case that the buffer layer is provided with the hollow structure at the position corresponding to the Oxide thin film transistor according to the embodiment of the present disclosure, the auxiliary film layer formed at the hollow structure may have a thickness ranging from 1,500 angstroms to 2,500 angstroms, inclusive. Thus, since the thickness of the groove structure, the thickness of the hollow structure, and the thickness of the auxiliary film layer is much less than the thickness of the buffer layer, by fabricating the Oxide thin film transistor in the groove structure, in the hollow structure or on the side of auxiliary film layer facing away from the substrate, the surface of the Oxide thin film transistor facing away from the substrate is lower than the surface of the LTPS thin film transistor facing away from the substrate, to avoid the case that the great height by which the Oxide thin film transistor protrudes from the substrate causes a great thickness of the LTPO display panel, thereby effectively solving the problem of the great thickness of the existing LTPO display panel. The small thickness of the flexible LTPO display panel is beneficial for bending.

In addition, in a case that the buffer layer is provided with the groove structure at the position corresponding to the Oxide thin film transistor according to the embodiment of the present disclosure, a filling film layer can also be formed on the groove structure, and the Oxide thin film transistor is fabricated on the filling film layer, where the surface of the stacked structure including the groove structure and the filling film layer facing away from the substrate is lower than the surface of the buffer layer. The filling film layer may have a thickness ranging from 1,500 angstroms to 2,500 angstroms, inclusive. In one embodiment, the filling film layer may be made of the same material as the auxiliary film layer.

In an embodiment of the present disclosure, the LTPS thin film transistor and the Oxide thin film transistor according to the present disclosure may be top gate thin film transistors or bottom gate thin film transistors, and during fabrication, the LTPS thin film transistor and the Oxide thin film transistor may share film structures to simplify the fabrication process. The type of the thin film transistor and the shared film structures according to the embodiments of the present disclosure are described in detail below with reference to FIGS. 3 to 6.

Figure 3:
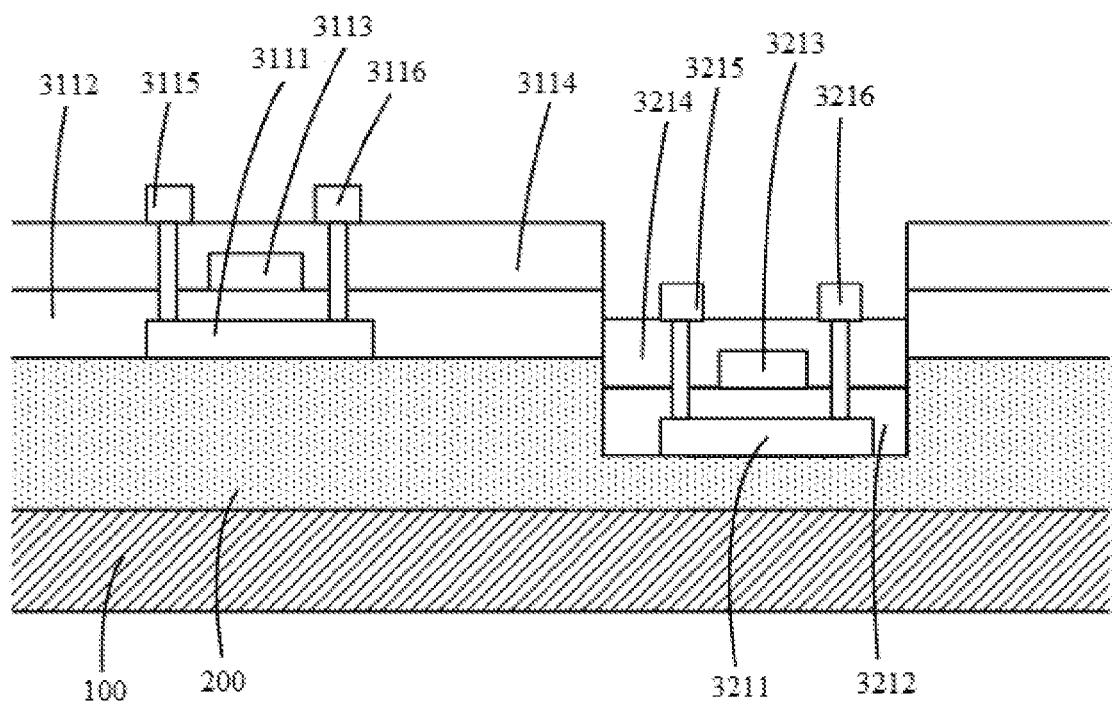
FIG. 3 is a schematic structural diagram of a display panel according to another embodiment of the present disclosure.

Referring to FIG. 3, which is a schematic structural diagram of a display panel according to another embodiment of the present disclosure, the LTPS thin film transistor 310 and the Oxide thin film transistor 320 are both top gate thin film transistors.

The LTPS thin film transistor includes: a low temperature polysilicon layer 3111, a first gate insulating layer 3112 located on a side of the low temperature polysilicon layer 3111 facing away from the substrate 100, a first gate 3113 located on a side of the first gate insulating layer 3112 facing away from the substrate 100, a first interlayer insulating layer 3114 located on a side of the first gate 3113 facing away from the substrate 100, and a first source 3115 and a first drain 3116 located on a side of the first interlayer insulating layer 3114 facing away from the substrate 100. The first source 3115 and the first drain 3116 are in contact with the low temperature polysilicon layer 3111 via through holes.

The Oxide thin film transistor includes an oxide semiconductor layer 3211, a second gate insulating layer 3212 located on a side of the oxide semiconductor layer 3211 facing away from the substrate 100, a second gate 3213 located on a side of the second gate insulating layer 3212 facing away from the substrate 100, a second interlayer insulating layer 3214 located on a side of the second gate 3213 facing away from the substrate 100, and a second source 3215 and a second drain 3216 located on a side of the second interlayer insulating layer 3214 facing away from the substrate 100. The second source 3215 and the second drain 3216 are in contact with the oxide semiconductor layer 3211 via through holes.

As shown in FIG. 3, film layer structures of the LTPS thin film transistor and the Oxide thin film transistor according to the embodiments of the present disclosure may be separately formed. In one embodiment, the first gate insulating layer 3112 may be used as the second gate insulating layer 3212, the second gate 3213 and the first gate 3113 may be formed by the same conductive layer, the first interlayer insulating layer 3114 may be used as the second interlayer insulating layer 3214, and the first source 3115, the first drain 3116, the second source 3215, and the second drain 3216 may be formed by the same conductive layer, which may be designed according to practical applications.

Figure 4:
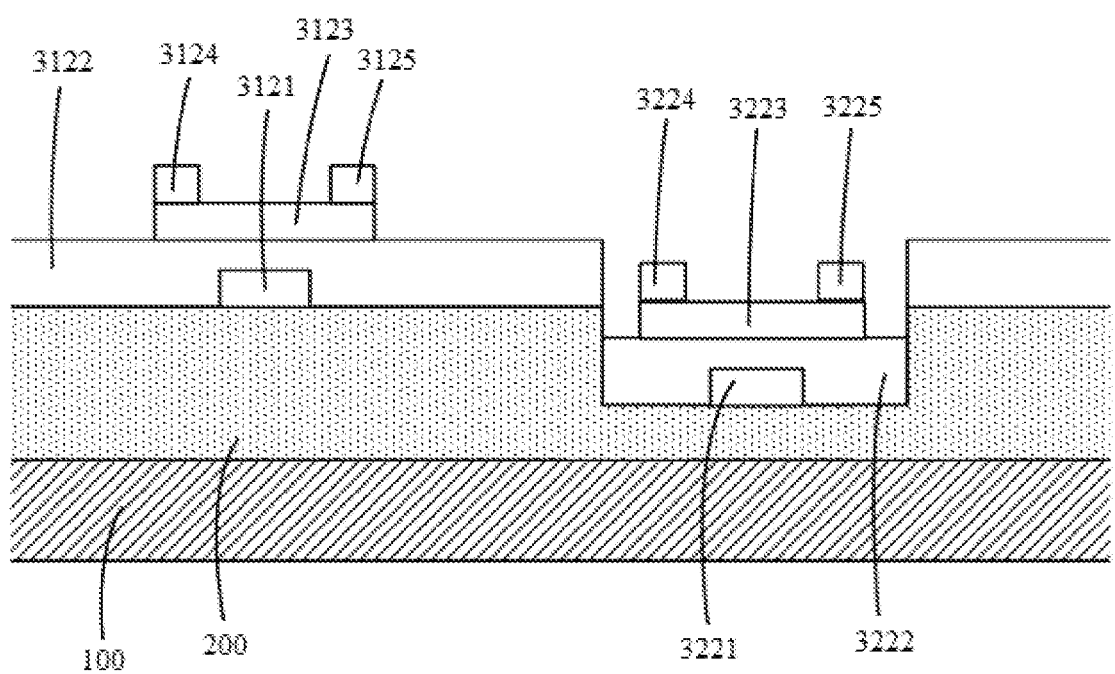
FIG. 4 is a schematic structural diagram of a display panel according to another embodiment of the present disclosure.

Referring to FIG. 4, which is a schematic structural diagram of a display panel according to another embodiment of the present disclosure, the LTPS thin film transistor 310 and the Oxide thin film transistor 320 are both bottom gate thin film transistors.

The LTPS thin film transistor includes a first gate 3121, a first gate insulating layer 3122 located on a side of the first gate 3121 facing away from the substrate 100, a low temperature polysilicon layer 3123 located on a side of the first gate insulating layer 3122 facing away from the substrate 100, and a first source 3124 and a first drain 3125 located on a side of the low temperature polysilicon layer 3123 facing away from the substrate 100.

The Oxide thin film transistor includes: a second gate 3221, a second gate insulating layer 3222 located on a side of the second gate 3221 facing away from the substrate 100, an oxide semiconductor layer 3223 located on a side of the second gate insulating layer 3222 facing away from the substrate 100, and a second source 3224 and a second drain 3225 located on a side of the oxide semiconductor layer 3223, facing away from the substrate 100.

As shown in FIG. 4, the film layer structures of the LTPS thin film transistor and the Oxide thin film transistor according to the embodiments of the present disclosure may be separately formed. In one embodiment, the second gate 3221 and the first gate 3121 may be formed by the same conductive layer, the first source 3124, the first drain 3125, the second source 3224, and the second drain 3225 may be formed by the same conductive layer, and the first gate insulating layer 3122 may be used as the second gate insulating layer 3222, which may be designed according to practical applications.

Figure 5:
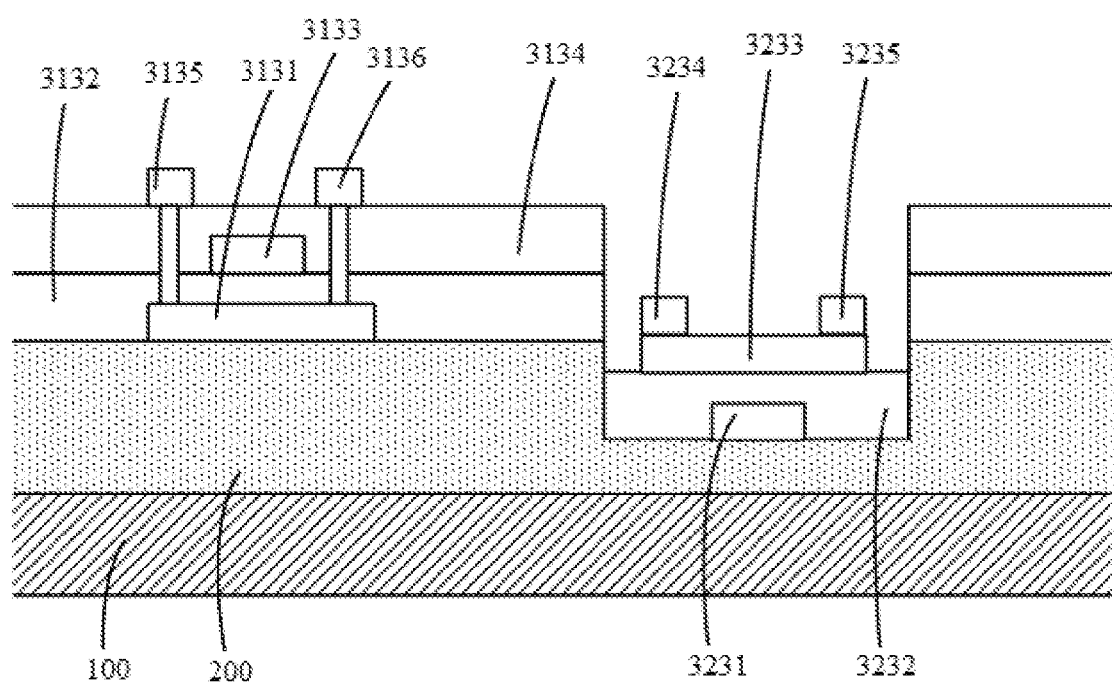
FIG. 5 is a schematic structural diagram of a display panel according to another embodiment of the present disclosure.

Referring to FIG. 5, which is a schematic structural diagram of a display panel according to another embodiment of the present disclosure, the LTPS thin film transistor 310 is a top gate thin film transistor, and the Oxide thin film transistor 320 is a bottom gate thin film transistor.

The LTPS thin film transistor includes a low temperature polysilicon layer 3131, a first gate insulating layer 3132 located on a side of the low temperature polysilicon layer 3131 facing away from the substrate 100, a first gate 3133 located on a side of the first gate insulating layer 3132 facing away from the substrate 100, a first interlayer insulating layer 3134 located on a side of the first gate 3133 facing away from the substrate 100, and a first source 3135 and a first drain 3136 located on a side of the first interlayer insulating layer 3134 facing away from the substrate 100. The first source 3135 and the first drain 3136 are in contact with the low temperature polysilicon layer 3131 via through holes.

The Oxide thin film transistor includes a second gate 3231, a second gate insulating layer 3232 located on a side of the second gate 3231 facing away from the substrate 100, an oxide semiconductor layer 3233 located on a side of the second gate insulating layer 3232 facing away from the substrate 100, and a second source 3234 and a second drain 3235 located on a side of the oxide semiconductor layer 3233 facing away from the substrate 100.

As shown in FIG. 5, the film layer structures of the LTPS thin film transistor and the Oxide thin film transistor according to the embodiments of the present disclosure may be separately formed. In one embodiment, the first gate 3133 and the second gate 3231 may be formed by the same conductive layer, the first gate insulating layer 3134 may be used as the second gate insulating layer 3232, and the first source 3135, the first drain 3136, the second source 3234, and the second drain 3235 may be formed by the same conductive layer, which may be designed according to practical applications.

Figure 6:
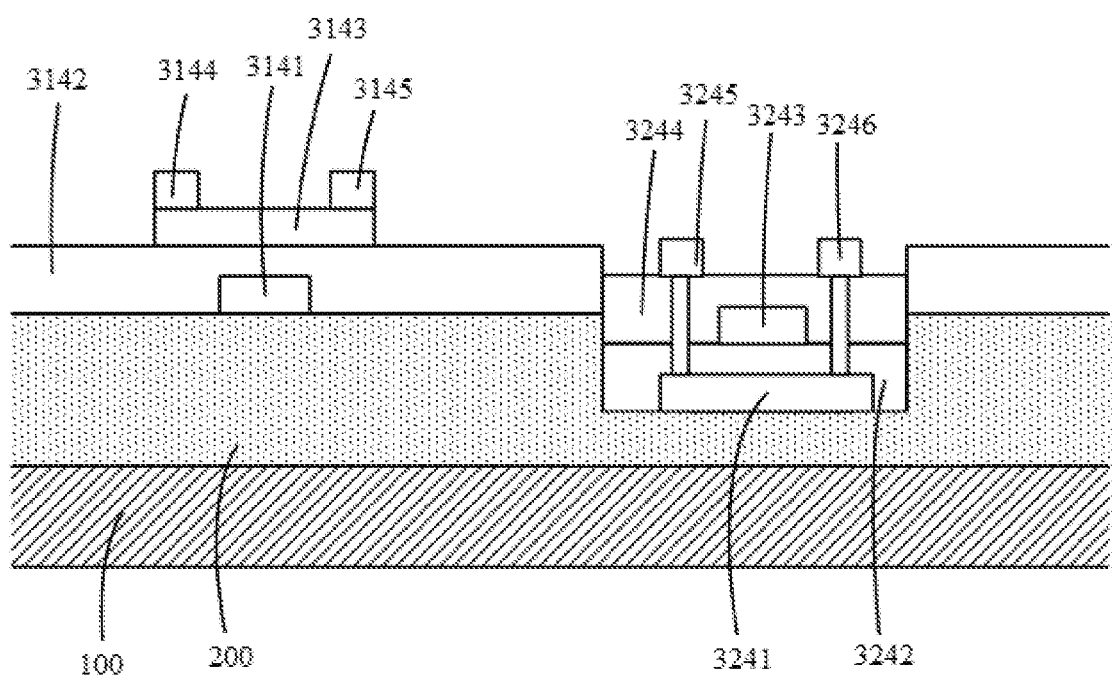
FIG. 6 is a schematic structural diagram of a display panel according to another embodiment of the present disclosure.

Referring to FIG. 6, which is a schematic structural diagram of a display panel according to another embodiment of the present disclosure, the LTPS thin film transistor 310 is a bottom gate thin film transistor, the Oxide thin film transistor 320 is a top gate thin film transistor.

The LTPS thin film transistor includes a first gate 3141, a first gate insulating layer 3142 located on a side of the first gate 3141 facing away from the substrate 100, a low temperature polysilicon layer 3143 located on a side of the first gate insulating layer 3142 facing away from the substrate 100, and a first source 3144 and a first drain 3145 located on a side of the low temperature polysilicon layer 3143 facing away from the substrate 100.

The Oxide thin film transistor includes an oxide semiconductor layer 3241, a second gate insulating layer 3242 located on a side of the oxide semiconductor layer 3241 facing away from the substrate 100, a second gate 3243 located on a side of the second gate insulating layer 3242 facing away from the substrate 100, a second interlayer insulating layer 3244 located on a side of the second gate 3243 facing away from the substrate 100, and a second source 3245 and a second drain 3246 located on a side of the second interlayer insulating layer 3244 facing away from the substrate 100. The second source 3245 and the second drain 3246 are in contact with the oxide semiconductor layer 3241 via through holes.

As shown in FIG. 6, the film layer structures of the LTPS thin film transistor and the Oxide thin film transistor according to the embodiments of the present disclosure may be separately formed. In one embodiment, the second gate 3243 and the first gate 3141 may be formed by the same conductive layer, the first gate insulating layer 3142 may be used as the second gate insulating layer 3244, and the first source 3144, the first drain 3145, the second source 3245, and the second drain 3246 may be formed by the same conductive layer, which may be designed according to practical applications.

Figure 7:
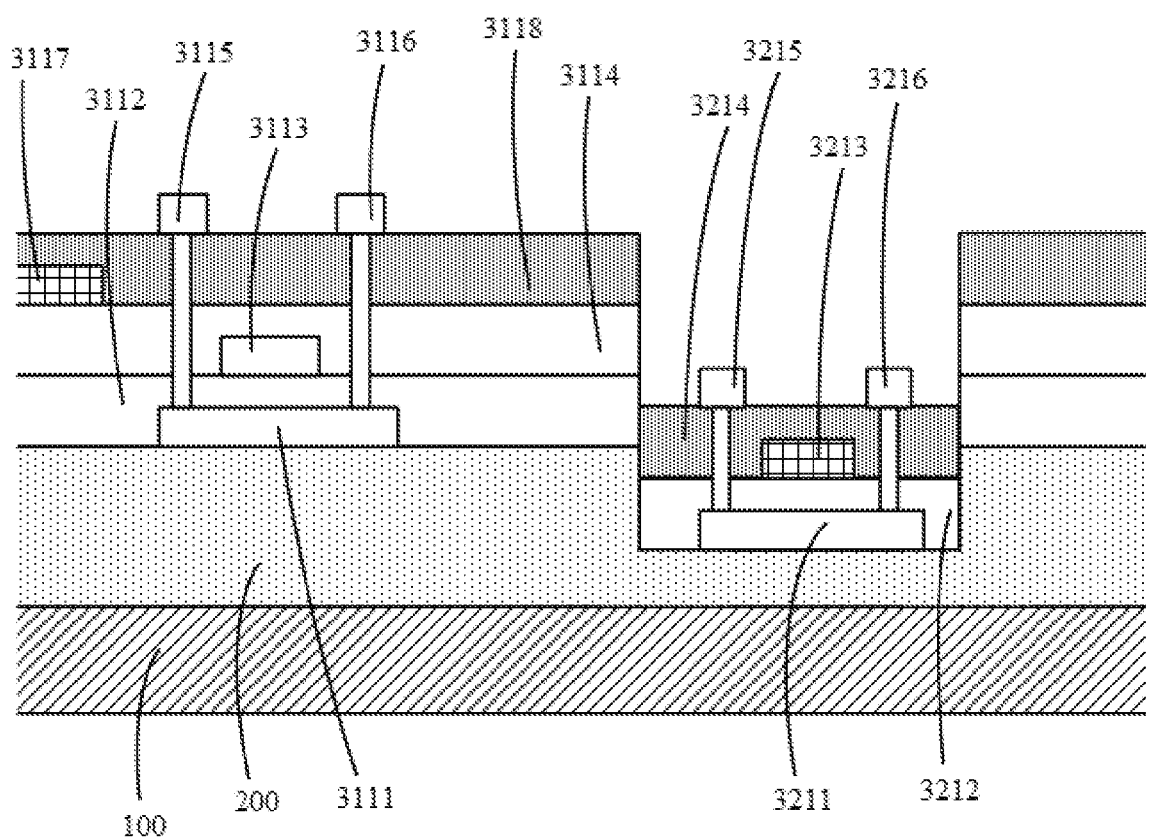
FIG. 7 is a schematic structural diagram of a display panel according to another embodiment of the present disclosure.

In an embodiment of the present disclosure, the display panel according to the present disclosure may further include an electrode layer between the conductive layer where the gate of the LTPS thin film transistor is located and the conductive layer where the source and the drain of the LTPS thin film transistor are located. The electrode layer is insulated from the gate, the source and the drain, and the electrode layer functions to form a capacitance with the conductive layer where the gate is located and/or the conductive layer where the source and the drain are located. The electrode layer and an insulating layer structure associated with the electrode layer may also be used by the Oxide thin film transistor according to an embodiment of the present disclosure. Reference is made to FIG. 7, which is a schematic structural diagram of a display panel according to an embodiment of the present disclosure. FIG. 7 shows an example in which the LTPS thin film transistor and the Oxide thin film transistor are both top gate thin film transistors.

In this embodiment, the display panel further includes an electrode layer 3117 located between the first interlayer insulating layer 3114 and the conductive layer where the first source 3115 and the first drain 3116 are located. A first insulating layer 3118 is further formed between the electrode layer 3117, and the first source 3115 and the first drain 3116.

As shown in FIG. 7, in the Oxide thin film transistor according to the embodiment of the present disclosure, the first gate insulating layer 3112 or the first interlayer insulating layer 3114 may be used as the second gate insulating layer 3212, the second gate 3123 may be formed by dividing the electrode layer 3117, the first insulating layer 3118 may be used as the second interlayer insulating layer 3214, and the first source 3115, the first drain 3116, the second source 3215, and the second drain 3216 may be formed by the same conductive layer, which may be designed according to practical applications.

It should be noted that FIG. 7 shows only a structure of a display panels to which the electrode layer and the insulating layer associated with the electrode layer according to the present disclosure are applicable. Regardless each of the LTPS thin film transistor and the Oxide thin film transistor being a top gate thin film transistor or a bottom gate thin film transistor, in a case that the display panel includes an electrode layer and an insulating layer associated with the electrode layer, respective film layers, electrode layers and associated insulating layers of the LTPS thin film transistor may be selectively used as film layers of the Oxide thin film transistor, such that the number of the formed layers can be reduced.

Figure 8:
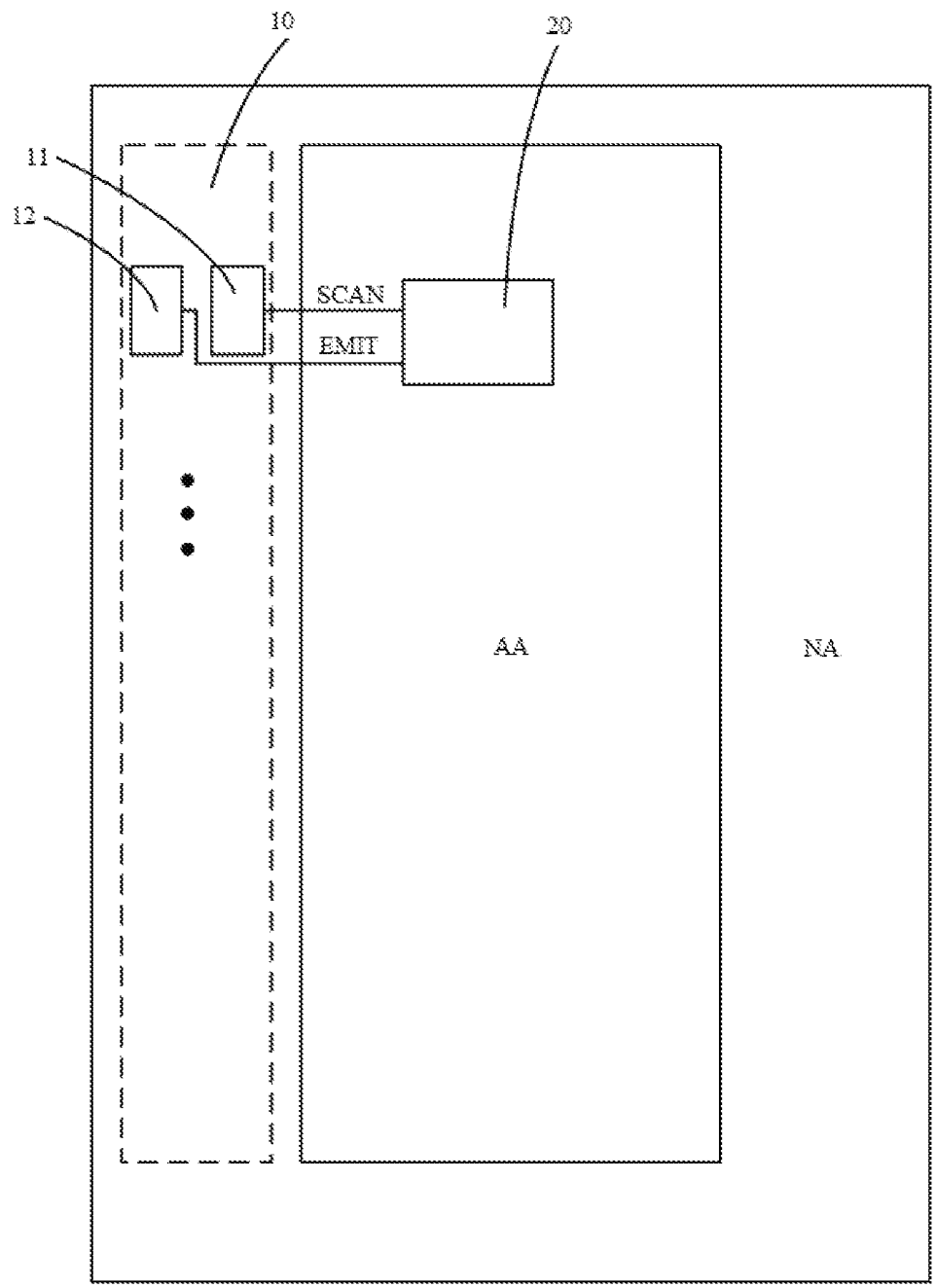
FIG. 8 is a schematic structural diagram of a display panel according to another embodiment of the present disclosure.
Figure 9:
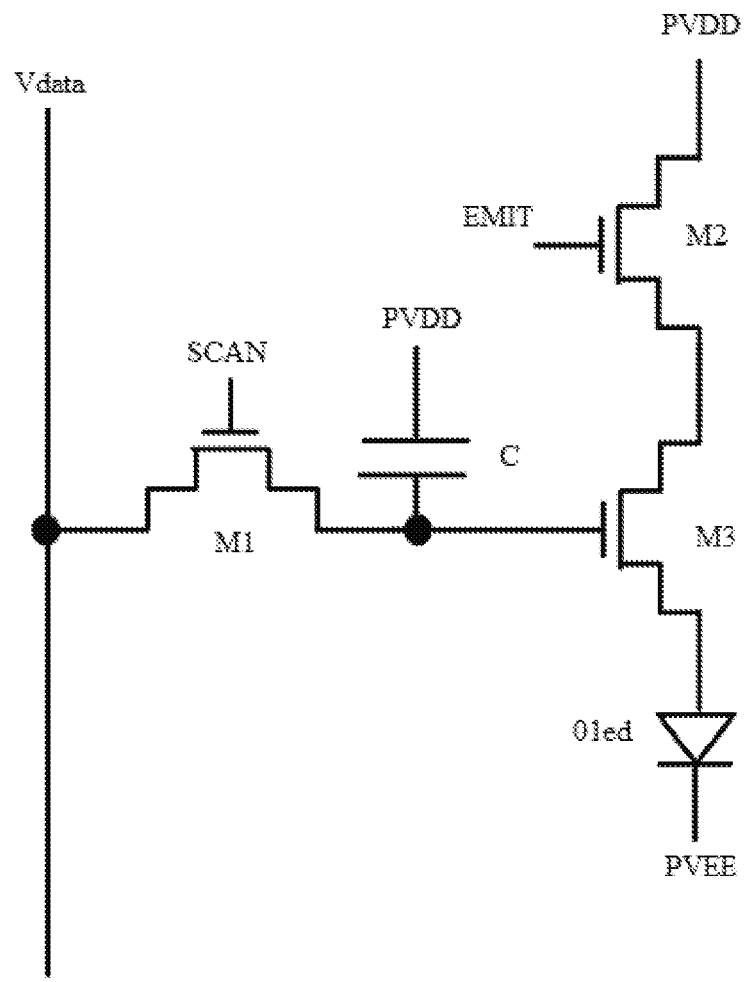
FIG. 9 is a schematic structural diagram of a pixel circuit according to an embodiment of the present disclosure.

Referring to FIGS. 8 and 9, FIG. 8 is a schematic structural diagram of a display panel according to another embodiment of the present disclosure, and FIG. 9 is a schematic structural diagram of a pixel circuit according to an embodiment of the present disclosure. The display panel includes a display region AA and a frame region NA surrounding the display region AA.

The frame region NA is provided with a driving circuit 10, and the display region AA is provided with multiple pixel circuits 20. The driving circuit 10 includes a scan control device 11 for generating a scan control signal SCAN and a light emitting control device 12 for generating a light emitting control signal EMIT. Each of the pixel circuits 20 include at least one thin film transistor M1 responsive to the scan control signal SCAN and at least one thin film transistor M2 responsive to the light emitting control signal EMIT.

At least one of the thin film transistors of the scan control device 11 is the Oxide thin film transistor, and/or, at least one of the thin film transistors of the light emitting control device 12 is the Oxide thin film transistor.

It should be noted that the driving circuit and the pixel circuits according to the embodiments of the present disclosure are connected in a manner, which is not described in the present disclosure.

Figure 10:
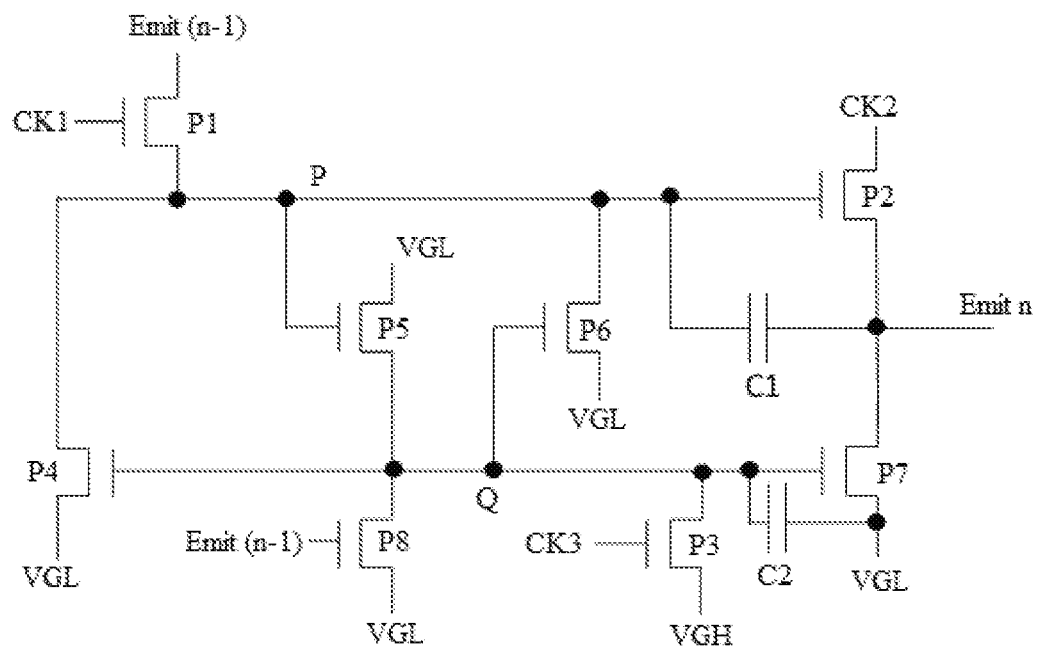
FIG. 10 is a schematic structural diagram of a light emitting control device according to an embodiment of the present disclosure.
Figure 11:
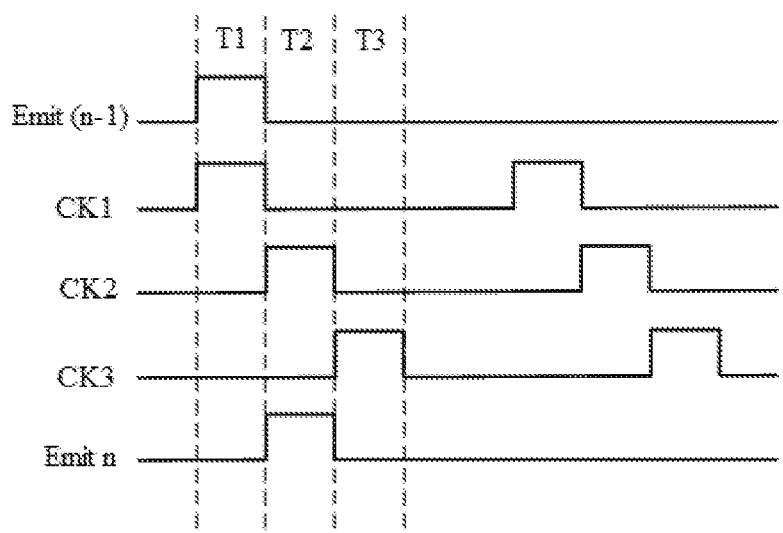
FIG. 11 is a timing view according to an embodiment of the present disclosure.

Referring to FIGS. 10 and 11, FIG. 10 is a schematic structural diagram of a light emitting control device according to an embodiment of the present disclosure, and FIG. 11 is a timing diagram according to an embodiment of the present disclosure. The light emitting control device includes: a first thin film transistor P1, a second thin film transistor P2, a third thin film transistor P3, a fourth thin film transistor P4, a fifth thin film transistor P5, a sixth thin film transistor P6, a seventh thin film transistor P7, an eighth film transistor P8, a first capacitor C1 and a second capacitor C2.

The gate of the first thin film transistor P1 is applied with a first clock signal CK1, and the first terminal of the first thin film transistor P1 is applied with an enable signal Emit (n−1) (for example, if multiple light emitting control devices are cascaded, the first terminal of the first thin film transistor of the current stage light emitting device may be connected to the output terminal of the upper stage light emitting control device), and the second terminal of the first thin film transistor P1 is connected to a pull-up node P.

The gate of the second thin film transistor P2 is connected to the pull-up node P, the first terminal of the second thin film transistor P2 is applied with a second clock signal CK2, and the second terminal of the second thin film transistor P2 is connected to the output terminal Emit n (for example, if multiple light emitting control devices are cascaded, the output terminal of the current stage light emitting device may be connected to the first terminal of the first thin film transistor of the next stage light emitting device).

The gate of the third thin film transistor P3 is applied with a third clock signal CK3, the first terminal of the third thin film transistor P3 is applied with a first reference signal VGH, and the second terminal of the third thin film transistor P3 is connected to a pull-down node Q.

The gate of the fourth thin film transistor P4 is connected to the pull-down node Q, the first terminal of the fourth thin film transistor P4 is connected to the pull-up node P, the second terminal of the fourth thin film transistor P4 is applied with a second reference signal VGL, where the first reference signal VGH and the second reference signal VGL are inverted with each other.

The gate of the fifth thin film transistor P5 is connected to the pull-up node P, the first terminal of the fifth thin film transistor P5 is applied with the second reference signal VGL, and the second terminal of the fifth thin film transistor P5 is connected to the pull-down node Q.

The gate of the sixth thin film transistor P6 is connected to the pull-down node Q, the first terminal of the sixth thin film transistor P6 is connected to the pull-up node P, and the second terminal of the sixth thin film transistor P6 is applied with the second reference signal VGL.

The gate of the seventh thin film transistor P7 is connected to the pull-down node Q, the first terminal of the seventh thin film transistor P7 is connected to the output terminal Emit n, and the second terminal of the seventh thin film transistor P7 is applied with the second reference signal VGL.

The gate of the eighth thin film transistor P8 is applied with the enable signal Emit (n−1), the first terminal of the eighth thin film transistor P8 is connected to the pull-down node Q, and the second terminal of the eighth thin film transistor P8 is applied with the second reference signal VGL. The first electrode plate of the first capacitor C1 is connected to the pull-up node P, and the second electrode plate of the first capacitor C1 is connected to the output terminal Emit n. The first electrode plate of the second capacitor C2 is connected to the pull-down node Q, and the second electrode plate of the second capacitor C2 is applied with the second reference signal VGL.

In an embodiment of the present disclosure, the first thin film transistor P1, the second thin film transistor P2, the third thin film transistor P3, the fourth thin film transistor P4, the fifth thin film transistor P5, the sixth thin film transistor P6, and the seventh thin film transistor P7 and the eighth thin film transistor P8 according to the present disclosure may all be N-type thin film transistors. In this case, the first reference signal VGH is a high level signal, and the second reference signal VGL is a low level signal. Referring to FIG. 11, the driving of the light emitting control device includes three stages including a first stage T1, a second stage T2, and a third stage T3.

In the first stage T1, the first thin film transistor P1 and the eighth thin film transistor P8 are turned on under control by the first clock signal CK1, then the enable signal Emit n is transmitted to the pull-up node P by the first thin film transistor P1, the second thin film transistor P2 and the fifth thin film transistor P5 are turned on under control by the pull-up node P, and the second clock signal CK2, which is at a low level at this time, is transmitted to the output terminal Emit n by the second thin film transistor P2, the second reference signal VGL is transmitted to the pull-down node Q by the fifth thin film transistor P5 and the eighth thin film transistor P8, the fourth thin film transistor P4, the sixth thin film transistor P6 and the seventh thin film transistor P7 are all turned off under control by the pull-down node Q, and the seventh thin film transistor P7 is turned off under control by the third clock signal CK3.

In the second stage T2, the first thin film transistor P1 and the eighth thin film transistor P8 are both turned off under control by the first clock signal CK1, then the second thin film transistor P2 and the fifth thin film transistor P5 are kept at a on state under control by the pull-up node P through the storage function of the first capacitor C1, and the other transistors are kept at the same state as in the first phase T1. At this time, the second clock signal CK2 which is at a high level is transmitted to the output terminal Emit n by the second thin film transistor P2 (for example, in a case that multiple light emitting control devices are cascaded, the output signal of the output terminal of the current stage light emitting control device is the enable signal of the next stage light emitting control device).

In the third stage T3, the first thin film transistor P1 and the eighth thin film transistor P8 are still turned off under control by the first clock signal CK1, and the third thin film transistor P3 is turned on under control by the third clock signal CK3 to transmit the first reference signal VGH to the pull-down node Q, the fourth thin film transistor P4, the sixth thin film transistor P6, and the seventh thin film transistor P7 are turned on under control by the pull-down node Q, and the second reference signal VGL is transmitted to the pull-up node P by the fourth thin film transistor P4 and the sixth thin film transistor P6, such that the second thin film transistor P2 and the fifth thin film transistor P5 are turned off under control by the pull-up node P, and the second reference signal VGL which is at a low level is transmitted to the output terminal Emit n by the seventh thin film transistor P7 to complete the driving of the current stage light emitting control device in this frame image. Before the light emitting control device of this stage is driven for the next frame image, it can be ensured that the second reference signal VGL is transmitted to the output terminal Emit n by the seventh thin film transistor P7 through the storage function of the second capacitor C2.

It should be noted that, in the light emitting control device according to the embodiment of the present disclosure, the first to eighth thin film transistors may be P-type thin film transistors, and at least one of the first to eighth thin film transistors according to the embodiments of the present disclosure may be the Oxide thin film transistor, which is not limited in the present disclosure.

It should be understood that the leakage current of the circuit can be reduced by using the Oxide thin film transistor in the driving circuit, thereby improving the low frequency stability and facilitating the bending of the display panel. However, since the size of the LTPS thin film transistor is smaller than the size of the Oxide thin film transistor, excessive Oxide thin film transistors provided in the circuit structure of the display panel occupy more space of the display panel, which is not conducive to the development trend of the narrow frame. Therefore, it is necessary to optimize the number of Oxide thin film transistors in the driving circuit, to ensure the high performance of the driving circuit and bending of the display device while ensuring that the occupied space does not affect the design of the narrow frame.

Figure 12:
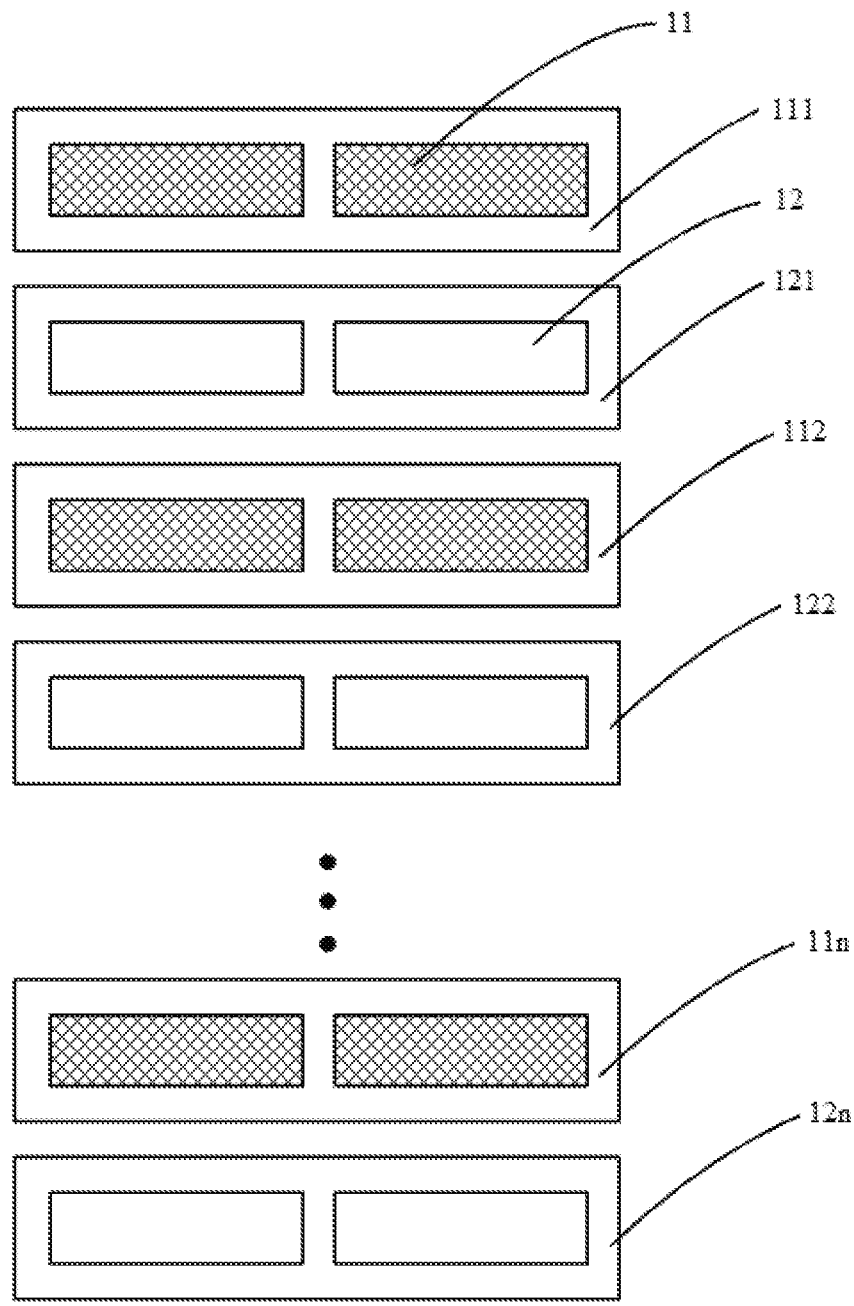
FIG. 12 is a schematic structural diagram of a driving circuit according to an embodiment of the present disclosure.

Referring to FIG. 12, which is a schematic structural diagram of a driving circuit according to an embodiment of the present disclosure, all scan control devices are grouped into a first scan control device group 111 to an Nth scan control device group 11$n$, and all the light emitting control devices are grouped into a first light emitting control device group 121 to an Nth light emitting control device group 12$n$, where N is an integer not less than 2. Each scan control device group includes at least one scan control device 11, and each light emitting control device group includes at least one light emitting control device 12, and the scan control device groups and the light emitting control device groups are alternately arranged in a direction perpendicular to the arrangement direction of the data line of the display panel. In a case that the scan control device group includes multiple scan control devices 11, the multiple scan control devices 11 are arranged along the arrangement direction of the data line (that is, the horizontal direction in the drawing), and in a case that the light emitting control group includes multiple light emitting control devices 12, the multiple light emitting control devices 12 are arranged along the arrangement direction of the data line (that is, the horizontal direction in the drawing). All the thin film transistors of the scan control devices 11 are Oxide thin film transistors, or all the thin film transistors of the light emitting control devices 12 are Oxide thin film transistors.

It should be understood that, by configuring all the thin film transistors of the scan control devices to be Oxide thin film transistors, or all the thin film transistors of the light emitting control devices to be Oxide thin film transistors, and by alternatively arranging the scan control device group and the light emitting control device group, the Oxide thin film transistors can be distributed in the driving circuit in a regular manner, which not only facilitates the layout design, but also facilitates the bending of the flexible display panel. In one embodiment, since the number of the light emitting control devices is less than the number of the scan control devices, to facilitate the design of the narrow frame, all the thin film transistors of the light emitting control device according to the embodiments of the present disclosure may be the Oxide thin film transistors.

It should be noted that, the numbers and positions of the Oxide thin film transistors in the scan control device and the light emitting control device are not limited to the above embodiment, may be configured in other manners in other embodiments of the present disclosure, which can be designed according to practical applications.

In addition, since the display region is large, the thin film transistors of the pixel circuit according to the embodiments of the present disclosure may all be the Oxide thin film transistors. The thin film transistor M1 responsive to the scan control signal SCAN and the thin film transistor M2 responsive to the light emitting control signal EMIT, and the driving transistor M3, as shown in FIG. 9, may all be Oxide thin film transistors.

Figure 13:
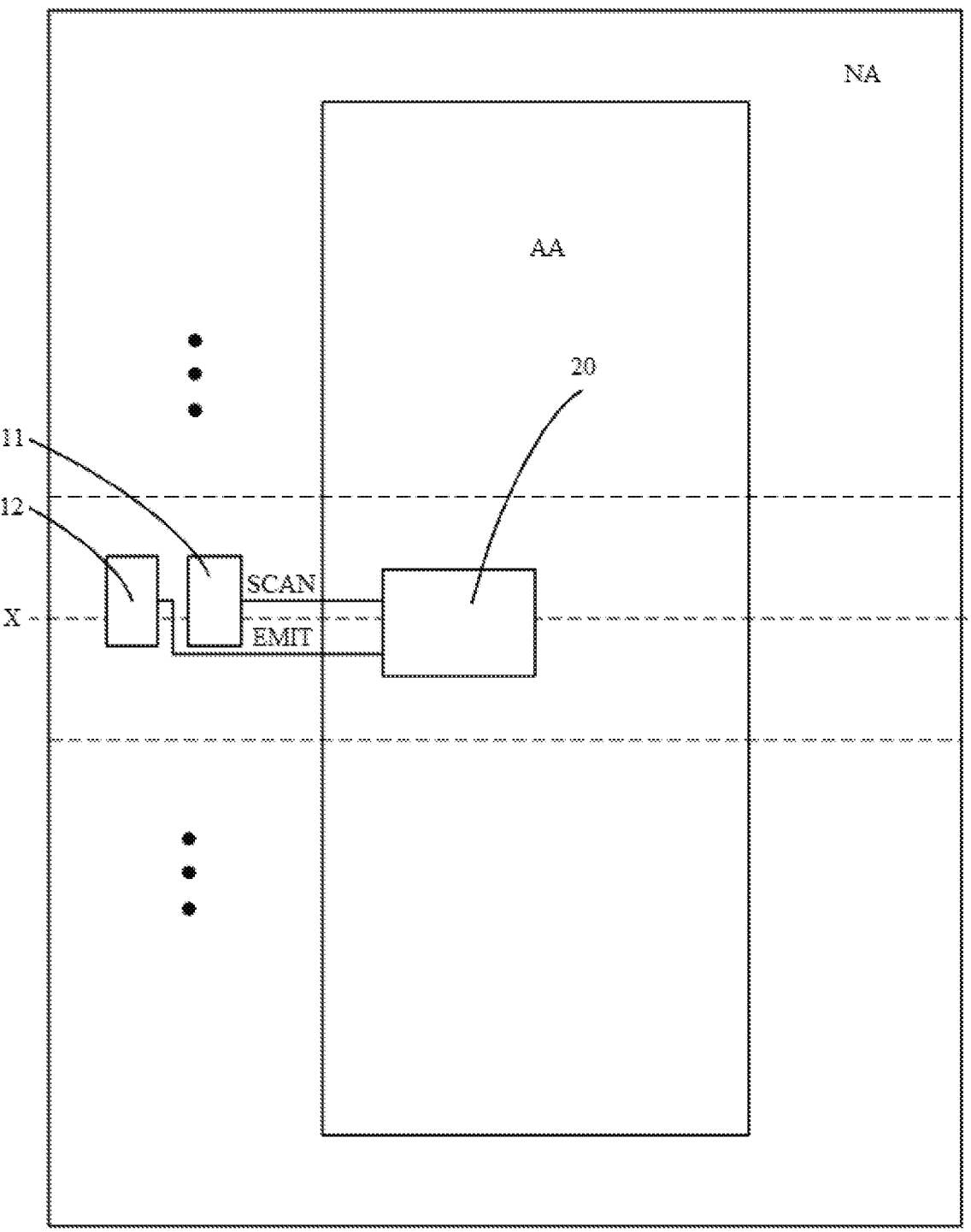
FIG. 13 a schematic structural diagram of a display panel according to another embodiment of the present disclosure.

Referring to FIG. 13, which is a schematic structural diagram of a display panel according to another embodiment of the present disclosure, the display panel according to the present disclosure further includes a bending region 30, where the thin film transistors of the driving circuit and the pixel circuits located in the bending region 30 are all the Oxide thin film transistors.

As shown in FIG. 13, the display panel is a bendable display panel, where the bending region 30 of the display panel includes one or more pixel circuits 20 located in the display region AA, and one or more scan control devices 11 and one or more light emitting control devices 12 located in the frame region NA. Along the extending direction of the axis X of the bending region 30, the scan control devices 11 and the light emitting control devices 12 are located on one side of the display region AA, or all the scan control devices 11 and the light emitting control devices 12 are grouped into two groups and located on two sides of the display region AA, which is not limited in this disclosure. In one embodiment, in the embodiment of the present disclosure, the thin film transistors that are located in the bending region 30 and that constitute the scan control device 11, the light emitting control device 12 and the pixel circuit 20 are all Oxide thin film transistors.

Further, all the groove structures or the hollow structures of the buffer layer corresponding to the Oxide thin film transistors are communicated with each other to reduce the overall thickness of the bending region, that is, the portion of the buffer layer corresponding to the bending region is a groove structure or a hollow structure, to reduce the overall thickness of the bending region, which is more advantageous for the bending of this region.

In any one of the above embodiments, the Oxide thin film transistor according to the present disclosure made of an oxide material including at least one of indium gallium zinc oxide, indium gallium oxide, indium tin zinc oxide, and aluminum zinc oxide.

In any of the above embodiments, the substrate according to the present disclosure may be a flexible substrate or a rigid substrate. The substrate may be made of glass, metal, or plastic, which is limited in the present disclosure, and the type and the material of the substrate are selected according to the practical applications.

Correspondingly, a display device is further provided in the embodiment of the present disclosure, which includes the display panel according to any one of the above embodiments.

It should be noted that the display device according to the embodiment of the present disclosure may be an organic light emitting display device or a liquid crystal display device, which is not limited in this disclosure.

A display panel and a display device are provided according to the present disclosure. The display panel is an LTPO display panel including at least one LTPS thin film transistor and at least one Oxide thin film transistor. The LTPS thin film transistor and the Oxide thin film transistor are both fabricated after the buffer layer is formed, that is, the LTPS thin film transistor and the Oxide thin film transistor are both formed on the side of the buffer layer facing away from the substrate. A groove structure or a hollow structure is provided on the buffer layer at a position corresponding to the Oxide thin film transistor, and the Oxide thin film transistor is fabricated in the groove structure or the hollow structure, to avoid the case that the great height by which the Oxide thin film transistor protrudes from the substrate causes a great thickness of the LTPO display panel, thereby effectively solving the problem of the great thickness of the existing LTPO display panel. The small thickness of the flexible LTPO display panel is beneficial for bending.

The invention claimed is:

1. A display panel, comprising:
a substrate;
a buffer layer, located on a surface of the substrate; and
one or more LTPS thin film transistors and one or more Oxide thin film transistors, located on a side of the buffer layer facing away from the substrate, wherein the buffer layer is provided with a hollow structure at a position corresponding to each of the one or more Oxide thin film transistors, wherein the display panel further comprises:
an auxiliary film layer located between the one of the one or more Oxide thin film transistors and the substrate, wherein a surface of the auxiliary film layer facing away from the substrate is lower than a surface of the buffer layer facing away from the substrate, the auxiliary film layer is only arranged in the hollow structure of the buffer layer, and a thickness of the auxiliary film layer is less than a thickness of a buffer layer, and the auxiliary film layer formed at the hollow structure has a thickness ranging from 1,500 angstroms to 2,500 angstroms, inclusive, and the buffer layer has a thickness ranging from 8,000 angstroms to 10,000 angstroms, inclusive, wherein,
the hollow structure of the buffer layer corresponding to one of the one or more Oxide thin film transistors is communicated with the hollow structure of the buffer layer corresponding to another one of the one or more Oxide thin film transistors, and
the auxiliary film layer is an inorganic film layer.

2. The display panel according to claim 1, wherein each of the one or more LTPS thin film transistors comprises insulating layers and wherein any one of the insulating layers of the LTPS thin film transistor functions as the auxiliary film layer.

3. The display panel according to claim 1, wherein
the display panel comprises a display region and a frame region surrounding the display region,
the frame region is provided with a driving circuit, and the display region is provided with a plurality of pixel circuits, the driving circuit comprises a scan control device for generating a scan control signal and a light emitting control device for generating a light emitting control signal, and each of the plurality of pixel circuits comprises at least one thin film transistor responsive to the scan control signal and at least one thin film transistor responsive to the light emitting control signal, and each of the scan control device and the light emitting control device comprises a plurality of thin film transistors, and
at least one of the thin film transistors of the scan control device is implemented by one of the one or more Oxide thin film transistors, or
at least one of the thin film transistors of the light emitting control device is implemented by the one of the one or more Oxide thin film transistors, or
at least one of the thin film transistors of the scan control device is implemented by the one of the one or more Oxide thin film transistors and at least one of the thin film transistors of the light emitting control device is implemented by the one of the one or more Oxide thin film transistors.

4. The display panel according to claim 3, wherein each of the thin film transistors of the light emitting control device is implemented by the one of the one or more Oxide thin film transistors.

5. The display panel according to claim 3, wherein each of the thin film transistors of the plurality of pixel circuits is implemented by the one of the one or more Oxide thin film transistors.

6. The display panel according to claim 3, further comprising a bending region, wherein each of the thin film transistors of the driving circuit and the plurality of pixel circuits located in the bending region is implemented by the one of the one or more Oxide thin film transistors.

7. The display panel according to claim 1, wherein each of the one or more Oxide thin film transistors is made of an oxide material comprising at least one of indium gallium zinc oxide, indium gallium oxide, indium tin zinc oxide and aluminum zinc oxide.

8. A display device, comprising:
a display panel, wherein the display panel comprises:
a substrate;
a buffer layer, located on a surface of the substrate; and
one or more LTPS thin film transistors and one or more Oxide thin film transistors, located on a side of the buffer layer facing away from the substrate, wherein the buffer layer is provided with a hollow structure at a position corresponding to each of the one or more Oxide thin film transistors, the display panel further comprises:
an auxiliary film layer located between the one of the one or more Oxide thin film transistors and the substrate, wherein a surface of the auxiliary film layer facing away from the substrate is lower than a surface of the buffer layer facing away from the substrate, the auxiliary film layer is arranged only in the hollow structure of the buffer layer, and a thickness of the auxiliary film layer is less than a thickness of a buffer layer, and the auxiliary film layer formed at the hollow structure has a thickness ranging from 1,500 angstroms to 2,500 angstroms, inclusive, and the buffer layer has a thickness ranging from 8,000 angstroms to 10,000 angstroms, inclusive, wherein
the hollow structure of the buffer layer corresponding to one of the one or more Oxide thin film transistors is communicated with the hollow structure of the buffer layer corresponding to another one of the one or more Oxide thin film transistors, and
the auxiliary film layer is an inorganic film layer.

9. The display device according to claim 8, wherein each of the one or more LTPS thin film transistors comprises insulating layers and wherein any one of the insulating layers of the LTPS thin film transistor functions as the auxiliary film layer.

10. The display device according to claim 8, wherein
the display panel comprises a display region and a frame region surrounding the display region,
the frame region is provided with a driving circuit, and the display region is provided with a plurality of pixel circuits, the driving circuit comprises a scan control device for generating a scan control signal and a light emitting control device for generating a light emitting control signal, and each of the plurality of pixel circuits comprises at least one thin film transistor responsive to the scan control signal and at least one thin film transistor responsive to the light emitting control signal, and each of the scan control device and the light emitting control device comprises a plurality of thin film transistors, and
at least one of the thin film transistors of the scan control device is implemented by the one of the one or more Oxide thin film transistors, or
at least one of the thin film transistors of the light emitting control device is implemented by the one of the one or more Oxide thin film transistors, or
at least one of the thin film transistors of the scan control device is implemented by the one of the one or more Oxide thin film transistors and at least one of the thin film transistors of the light emitting control device is implemented by the one of the one or more Oxide thin film transistors.

11. The display device according to claim 10, wherein each of the thin film transistors of the light emitting control device is implemented by the one of the one or more Oxide thin film transistors.

12. The display device according to claim 10, wherein each of the thin film transistors of the plurality of pixel circuits is implemented by the one of the one or more Oxide thin film transistors.

13. The display device according to claim 10, further comprising a bending region, wherein each of the thin film transistors of the driving circuit and the plurality of pixel circuits located in the bending region is implemented by the one of the one or more Oxide thin film transistors.

14. The display device according to claim 8, wherein each of the one or more Oxide thin film transistors is made of an oxide material comprising at least one of indium gallium zinc oxide, indium gallium oxide, indium tin zinc oxide and aluminum zinc oxide.

15. A display panel, comprising:
a substrate;
a buffer layer, located on a surface of the substrate;
one or more LTPS thin film transistors and one or more Oxide thin film transistors, located on a side of the buffer layer facing away from the substrate, wherein the buffer layer is provided with a hollow structure at a position corresponding to each of the one or more Oxide thin film transistors; and
an auxiliary film layer located between the one of the one or more Oxide thin film transistors and the substrate, wherein a surface of the auxiliary film layer facing away from the substrate is lower than a surface of the buffer layer facing away from the substrate, and a thickness of the auxiliary film layer is less than a thickness of a buffer layer, wherein the display panel has a display region and a frame region surrounding the display region, the frame region is provided with a driving circuit, and the display region is provided with a plurality of pixel circuits, the driving circuit comprises scan control devices for generating a scan control signal and light emitting control devices for generating a light emitting control signal, the scan control devices are grouped into N first scan control device groups, and the light emitting control devices are grouped into N first light emitting control device groups, where N is an integer not less than 2, each of the N scan control device groups comprises at least one of the scan control devices, and each of the N light emitting control device groups comprises at least one of the light emitting control devices, and the N scan control device groups and the N light emitting control device groups are alternately arranged in a direction perpendicular to the arrangement direction of the data line of the display panel, each of the plurality of pixel circuits comprises at least one thin film transistor responsive to the scan control signal and at least one thin film transistor responsive to the light emitting control signal, each of the scan control devices and each of the light emitting control devices comprises a plurality of thin film transistors, and the plurality of thin film transistors of each of the scan control devices are Oxide thin film transistors, or the plurality of thin film transistors of each of the light emitting control devices are Oxide thin film transistors.

* * * * *